United States Patent
Yang et al.

(10) Patent No.: US 8,456,942 B2
(45) Date of Patent: *Jun. 4, 2013

(54) REGULATORS REGULATING CHARGE PUMP AND MEMORY CIRCUITS THEREOF

(75) Inventors: Tien-Chun Yang, San Jose, CA (US); Chih-Chang Lin, San Jose, CA (US); Ming-Chieh Huang, San Jose, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/535,034

(22) Filed: Jun. 27, 2012

(65) Prior Publication Data

US 2012/0268196 A1 Oct. 25, 2012

Related U.S. Application Data

(63) Continuation of application No. 12/716,430, filed on Mar. 3, 2010, now Pat. No. 8,223,576.

(60) Provisional application No. 61/165,185, filed on Mar. 31, 2009.

(51) Int. Cl.
*G11C 5/14* (2006.01)

(52) U.S. Cl.
USPC .................. 365/226; 365/189.07; 365/189.09

(58) Field of Classification Search
USPC 365/226, 227, 189.07, 189.09, 207; 327/537, 327/540, 541, 543, 544; 363/59, 30
See application file for complete search history.

(56) References Cited

U.S. PATENT DOCUMENTS

| | | | |
|---|---|---|---|
| 5,218,569 A | 6/1993 | Banks | |
| 6,288,951 B1 | 9/2001 | Chen et al. | |
| 6,958,594 B2 | 10/2005 | Redl et al. | |
| 7,538,602 B2 | 5/2009 | Takeuchi | |
| 7,868,604 B2 | 1/2011 | Tran et al. | |
| 8,223,576 B2 * | 7/2012 | Yang et al. | 365/226 |

* cited by examiner

*Primary Examiner* — Gene Auduong
(74) *Attorney, Agent, or Firm* — Lowe Hauptman Ham & Berner, LLP

(57) ABSTRACT

A regulator for regulating a charge pump is provided. The regulator includes a comparator having a first input end capable of receiving a first voltage and a second input end capable of receiving a second voltage for determining enabling or disabling the charge pump. The first voltage is associated with an output voltage of the charge pump. The second voltage is associated with an internal power voltage and a reference voltage $V_{ref}$.

20 Claims, 4 Drawing Sheets

US 8,456,942 B2

REGULATORS REGULATING CHARGE PUMP AND MEMORY CIRCUITS THEREOF

CROSS-REFERENCES TO RELATED APPLICATIONS

The present application is a continuation of U.S. application Ser. No. 12/716,430, filed Mar. 3, 2010, which claims the priority of U.S. Provisional Application No. 61/165,185, filed on Mar. 31, 2009, which are incorporated herein by reference in their entireties.

TECHNICAL FIELD

The present disclosure relates generally to the field of semiconductor circuits, and more particularly, to regulators regulating a charge pump and memory circuits thereof.

BACKGROUND

Memory circuits have been used in various applications. Conventionally, memory circuits can include DRAM and SRAM circuits. A DRAM circuit includes a plurality of memory cells. For conventional dynamic memory cells in which arrays of capacitive storage memory cells are provided, each memory cell has an access transistor. Data stored in such memory cells is actually a charge stored on a small capacitor. When the data is to be output, the access transistor is activated by a word line (WL) coupled to the gate or control terminal of the transistor. The access transistor can couple the capacitor to a bit line (BL) coupled to a sense amplifier for sensing the voltage of the capacitor.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Figure 1:
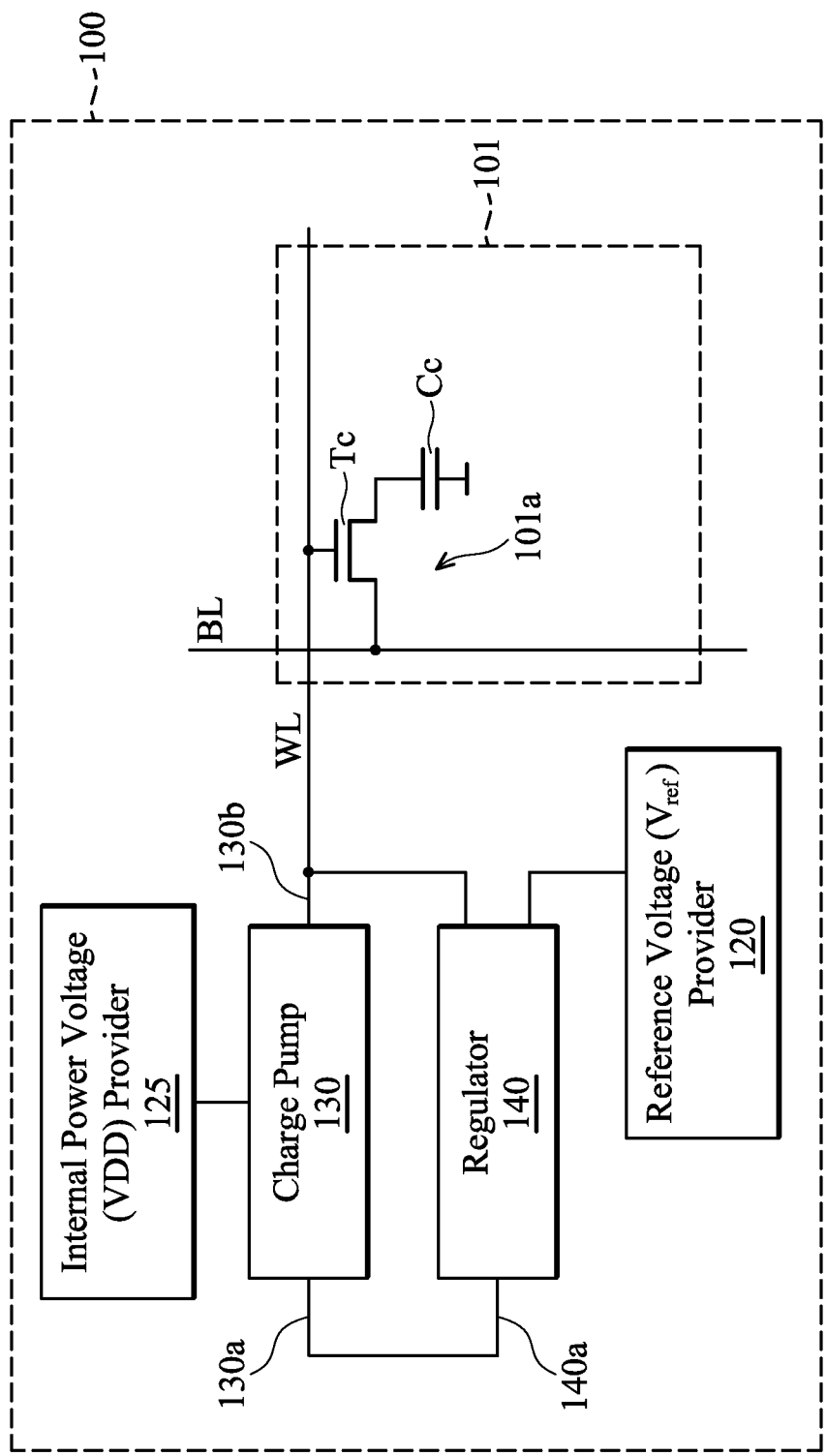
FIG. 1 is a schematic drawing illustrating an exemplary memory circuit.

A pumped word line voltage is applied to the word line to turn on the transistor of the memory cell. A voltage regulator is provided to detect the pumped word line voltage and to enable or disable a charge pump that pumps the word line voltage. The voltage regulator has at least two stage amplifiers for amplifying input signals and determining if the pumped word line voltage is overshot or undershot. A first stage amplifier of the voltage regulator has a negative feedback loop between an output end and a negative input end of the first amplifier. The first stage amplifier provides a voltage difference between the pumped word line voltage and an internal power voltage to a second stage amplifier. The second stage amplifier receives and compares the voltage difference between the pumped word line voltage and the internal power voltage with a reference voltage. If the voltage difference between the pumped word line voltage and the internal power voltage is higher than the reference voltage, the voltage regulator disables the charge pump. If the voltage difference between the pumped word line voltage and the internal power voltage is lower than the reference voltage, the voltage regulator enables the charge pump.

Ideally, a gain of the first stage amplifier is infinite. However, a realistic gain of the first stage amplifier could be only reached about 100 or more. The limited gain of the first stage amplifier causes an output to the second stage amplifier that is substantially different from the voltage difference of the pumped word line voltage and the internal power voltage. The concern becomes worse when the memory circuit operates at a worst corner SSS due to Process-Voltage-Temperature (PVT) variations, wherein the SSS represents that speeds of NMOS transistors, PMOS transistors, and memory transistors are slow.

It is found that the first stage amplifier and its negative feedback loop also substantially delay responses for enabling or disabling that charge pump after detecting that the voltage difference between the pumped word line voltage and the internal power voltage is lower or higher than the reference voltage, respectively.

It is also found that the memory circuit may operate at the SSS corner of the PVT variations. The internal power voltage VDD of the memory circuit may shift to about 0.765 V. When the 0.765-V internal power voltage VDD is applied to the amplifiers of the voltage regulator, headroom of the amplifiers, i.e., the voltage difference between the internal power voltage VDD and ground, are reduced. The lowered headroom of the amplifiers narrows margins of the amplifiers to operate at saturation modes to obtain high gains. The lowered headroom may adversely affect the first stage amplifier that needs a gas as large as possible.

Based on the foregoing, memory circuits and operating methods thereof are desired.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure relate to regulators regulating a charge pump, memory circuits, and systems thereof. The regulator is capable of enabling or disabling the charge pump with a high frequency and/or controlling variations of an output voltage of the charge pump within a small margin.

FIG. 1 is a schematic drawing illustrating an exemplary memory circuit. In

FIG. 1, a memory circuit 100 can comprise a memory array 101 including a plurality of word lines and a plurality of bit lines. The memory circuit 100 can be a dynamic random access memory (DRAM) circuit, an embedded DRAM circuit, a static random access memory (SRAM) circuit, an embedded SRAM circuit, a non-volatile memory, e.g., FLASH, EPROM, E²PROME, or other memory circuit. The memory array 101 can include at least one memory cell 101a. The memory cell 101a can be coupled with a bit line (BL) and a word line (WL) of the memory array 101. For embodiments using DRAM cells, the memory cell 101a can include a memory transistor ($T_c$) and a capacitor ($C_c$). The capacitor $C_c$ is capable of storing a charge representative of a datum, e.g., "0" or "1".

It is noted that though only one memory cell 101a is depicted, another cell (not shown) can be placed at the intersection of each of a plurality of word lines (WL) and the bit lines (BL). A portion of a memory circuit 100 may have 8, 16, 32, 64, 128, or more columns that can be arranged in word widths. In some embodiments, the word lines can be laid out substantially orthogonally to the bit lines. In other embodiments, other arrangements of the word lines and bit lines can be provided.

Referring to FIG. 1, the memory circuit 100 can include a charge pump 130 coupled with the word line WL of the memory array 101. The charge pump 130 is capable of pumping a voltage to a higher level. For example, the charge pump 130 can receive and pump a voltage, e.g., an internal power voltage VDD, providing an output voltage, e.g., a pump voltage VPP. The internal power voltage VDD can be provided by an internal power voltage provider 125. The pump voltage VPP can turn on the memory transistor $T_c$ for accessing data stored within the memory cell 101a. For embodiments using a 0.9-V nominal voltage, the pump voltage VPP can be around VDD+ΔV, wherein ΔV can be, for example, 0.7 V or any suitable voltage that is capable of helping turning on the memory transistor $T_c$.

Referring again to FIG. 1, the memory circuit 100 can include a regulator 140 coupled between an input end 130a and an output end 130b of the charge pump 130. The regulator 140 is capable of receiving a reference voltage $V_{ref}$ from a reference voltage provider 120 for determining enabling or disabling the charge pump 130. The reference voltage $V_{ref}$ is provided to the regulator 140 for determining if the output, e.g., the pump voltage VPP, of the charge pump 130 is over or under a predetermined voltage. In embodiments, the reference voltage $V_{ref}$ can be equal to the difference between the pump voltage and the internal power voltage (VPP−VDD). In embodiments for using a 0.9-V nominal voltage, the reference voltage provider 120 is capable of generating a voltage varying from about 0.4 V to about 0.7 V. In other embodiments, the reference voltage provider 120 can receive a trim bit signal (not shown) to select a fixed voltage that can be output as the reference voltage $V_{ref}$. It is noted that the range of the reference voltage is mere examples. The scope of the disclosure is not limited thereto.

By detecting the pump voltage VPP at the output end 130b of the charge pump 130 and receiving the reference voltage $V_{ref}$, the regulator 140 may output a signal on an output end 140a of the regulator 140 coupled to the input end of the charge pump 130 for enabling or disabling the charge pump 130 if the pump voltage VPP is lower or higher than a predetermined voltage, e.g., VDD+$V_{ref}$. For example, the regulator 140 may disable the charge pump 130 during about 1 nanosecond and about 5 nanoseconds after detecting the pump voltage is higher than the predetermined voltage, e.g., VPP+$V_{ref}$. It is noted that the regulator 140 can desirably enable or disable the charge pump 130 such that overshoots of the pump voltage VPP with respect to the predetermined voltage, e.g., VPP+$V_{ref}$, can be defined within a desired margin, e.g., ±50 mV. In some embodiments, the margin can be about several millivolts or less. In other embodiments, the margin can be about ±1 mV. The regulator 140 can provide a desired sensitivity for the output of the charge pump 130. It is also found that the regulator 140 can swiftly enable or disable the charge pump 130 during a small period of time, e.g., 1 nanosecond to 5 nanoseconds, after detecting that the pump voltage VPP is lower or higher than the predetermined voltage, e.g., VPP+$V_{ref}$. The regulator 140 can desirably enable or disable the charge pump 130 at a high frequency. Compared with a conventional voltage regulator, the regulator 140 can provide a more sensitive detection for the pump voltage VPP and provide a swifter enabling or disabling of the charge pump 130. It is noted that the voltage margin and/or the time period for enabling or disabling the charge pump 130 are mere examples. One of skill in the art is able to modify the voltage margin and/or the time period to achieve a desired memory circuit.

Figure 2:
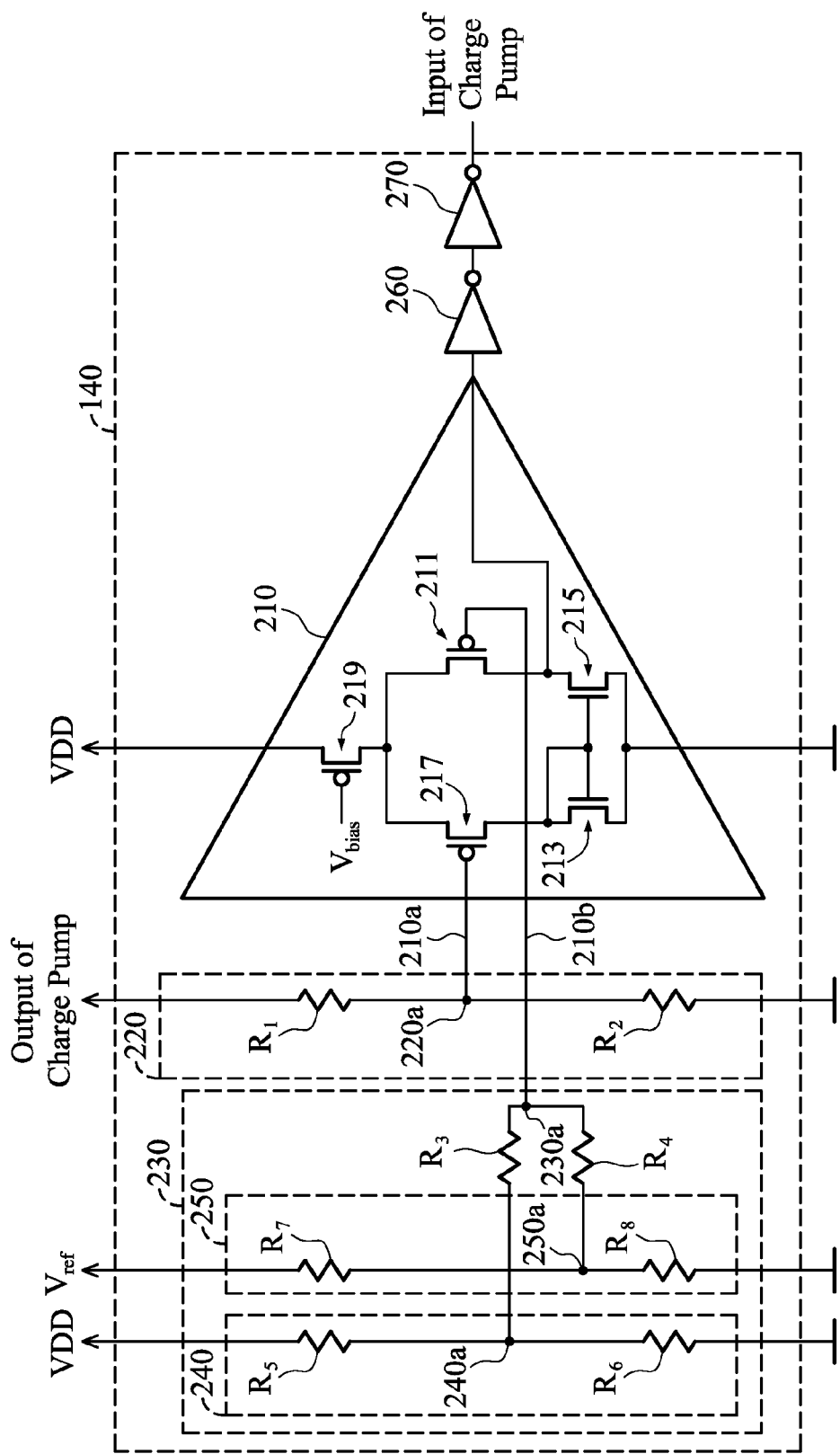
FIG. 2 is a schematic drawing showing an exemplary regulator according to an embodiment.

FIG. 2 is a schematic drawing showing an exemplary regulator according to an embodiment of the present disclosure. In FIG. 2, the regulator 140 can include a comparator 210. The comparator 210 can have a first input end 210a, e.g., a positive input end, capable of receiving a first voltage and a second input end 210b, e.g., a negative input end, capable of receiving a second voltage for determining enabling or disabling the charge pump 130 (shown in FIG. 1). The first voltage can be associated with the output voltage, e.g., the pump voltage VPP, detected at the output end 130b of the charge pump 130. The second voltage can be associated with an internal voltage VDD and the reference voltage $V_{ref}$. In some embodiments, the comparator 210 can be an amplifier that can include PMOS transistors 211, 217, 219 and NMOS transistors 213, 215, which can be arranged as shown in FIG. 2. It is noted that the type, number, and/or the configuration of the transistors of the comparator 210 are mere examples. One of skill in the art can modify the type, the number, and/or the configuration of the transistors to achieve a desired regulator.

As noted, the first voltage is associated with the pump voltage VPP and the second voltage is associated with the internal voltage VDD and the reference voltage $V_{ref}$. In embodiments, the comparator 210 is capable of comparing the first voltage and second voltage for determining enabling or disabling the charge pump 130. For example, the first voltage can be VPP/2K and the second voltage can be (VDD+$V_{ref}$)/2K. If VPP/2K>(VDD+$V_{ref}$)/2K, the regulator 140 can disable the charge pump 130. If VPP/2K<(VDD+$V_{ref}$)/2K, the regulator 140 can enable the charge pump 130. K is a factor associated with the internal power voltage VDD at a worst corner SSS of Process-Voltage-Temperature (PVT) variations.

Figure 3:
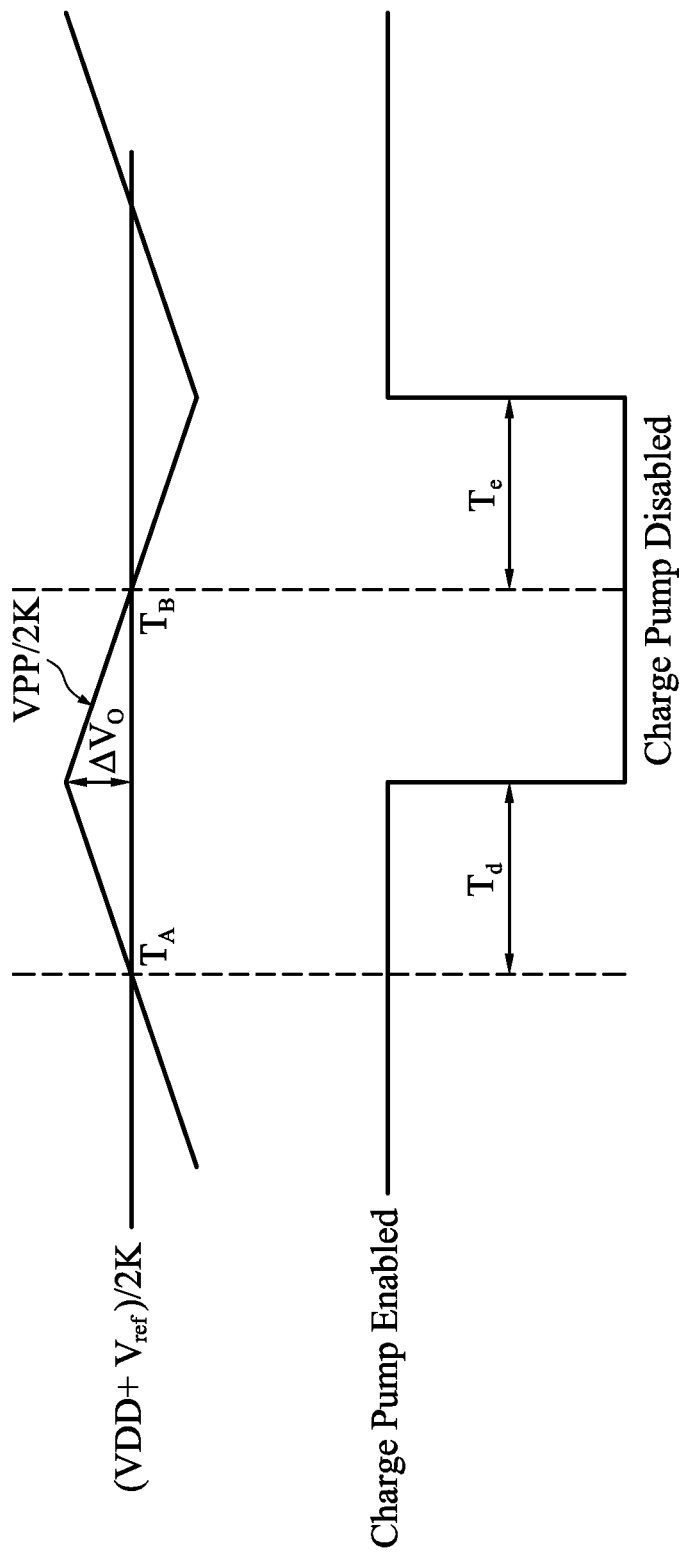
FIG. 3 is a schematic drawing illustrating voltage diagrams of the first and second voltages and operation of the charge pump.

Following are descriptions regarding the comparison of the first and second voltages for enabling or disabling the charge pump. FIG. 3 is a schematic drawing illustrating voltage diagrams of the first and second voltages and corresponding operations of the charge pump. In FIG. 3, before time $T_A$, the first voltage VPP/2K is lower than the second voltage (VDD+$V_{ref}$)/2K. The regulator 140 can output a signal, enabling the charge pump 130. After time $T_A$, the regulator 140 detects that the first voltage VPP/2K is higher than the second voltage (VDD+$V_{ref}$)/2K. The regulator 140 can output a signal, disabling the charge pump 130 after a period of time $T_d$, e.g., between about 1 ns and about 5 ns. As noted, the regulator 140 can desirably reduce delays for disabling the charge pump 130 after detecting that the first voltage VPP/2K is higher than the second voltage (VDD+$V_{ref}$)/2K. After time $T_B$, the regulator 140 detects that the first voltage VPP/2K is lower than the second voltage (VDD+$V_{ref}$)/2K. The regulator 140 can output a signal, enabling the charge pump 130 after a period of time $T_e$, e.g., between about 1 ns and about 5 ns. As noted, the regulator 140 can desirably reduce delays for enabling the charge pump 130 after detecting that the first voltage VPP/2K is lower than the second voltage (VDD+$V_{ref}$)/2K. It is noted that the overshoot $\Delta V_o$ of the first voltage VPP/2K with respect to the second voltage (VDD+$V_{ref}$)/2K can be kept within a small margin, e.g., several millivolts or less.

As noted, the first voltage can be VPP/2K, wherein K is a factor associated with the internal power voltage VDD at a worst corner SSS of Process-Voltage-Temperature (PVT) variations. In some embodiments, the regulator 140 can include a first voltage divider, e.g., voltage divider 220. The voltage divider 220 can have an output end 220a coupled with the first input end 210a of the comparator 210. The voltage divider 220 can be coupled with the output end 130b of the charge pump 130 (shown in FIG. 1), detecting the pump voltage VPP. The voltage divider 220 is capable of providing the first voltage VPP/2K to the comparator 210. In some embodiments, the voltage divider 220 can include resistors, diodes, other devices that are capable of providing the first voltage VPP/2K, and/or any combinations thereof. For example, the voltage divider 220 can include resistors having resistances $R_1$ and $R_2$. The output end 220a is between the resistors as shown in FIG. 2. The first voltage VPP/2K can be equal to VPP×$R_2$/($R_1$+$R_2$). K is equal to ($R_1$+$R_2$)/2$R_2$.

As noted, the second voltage applied to the second input end 210b of the comparator 210 can be associated with the internal power voltage VDD and the reference voltage $V_{ref}$. In embodiments, the second voltage can be equal to about (VDD+$V_{ref}$)/2K.

As noted, the comparator 210 compares the first voltage VPP/2K and the second voltage (VDD+$V_{ref}$)/2K for determining enabling or disabling the charge pump 130.

Following is the description regarding selecting the factor K. In embodiments using a 0.9-V nominal voltage, the internal power voltage VDD at the SSS corner may shift to around 0.765 V. The threshold voltages $V_T$ of PMOS transistors 211, 217, and 219 can be between around −0.5 V and around −0.55 V. The threshold voltages $V_T$ of NMOS transistors 213 and 215 can be between around 0.5 V and around 0.55 V. In order to have a desired gain or a maximum gain for the comparator 210, the PMOS transistors 211, 217, 219 and NMOS transistors 213, 213 may operate at the saturation modes. To operate at the saturation modes, each of the transistors 211, 213, 215, 217, and 219 may have a gate-to-source voltage $V_{GS}$>threshold voltage $V_T$ of the transistor and a gate-to-drain voltage $V_{GD}$<threshold voltage $V_T$ of the transistor. As noted, in some embodiments, at the SSS corner the internal power voltage VDD can shift to around 0.765V, the PMOS transistors 211, 217, and 219 may have a threshold voltage $V_T$ of about −0.5 V, and the NMOS transistors 213 and 215 may have a threshold voltage $V_T$ of about 0.5 V. It is found that the margin of the first voltage VPP/2K and the second voltage (VDD+$V_{ref}$)/2K for operating all of the transistors 211, 213, 215, 217, and 219 at that saturation modes may be between about 0.1 V and about 0.265 V. That is the first voltage VPP/2K and the second voltage (VDD+$V_{ref}$)/2K may be any value between about 0.1 V and about 0.265 V.

As noted, the first voltage VPP/2K can vary depending on the pump voltage VPP, and the second voltage (VDD+$V_{ref}$)/2K can be fixed after the internal voltage VDD and the reference voltage $V_{ref}$ are selected after circuit and/or device testing. The second voltage (VDD+$V_{ref}$)/2K can be used as a reference compared with the first voltage VPP/2K for determining enabling or disabling the charge pump 130.

In embodiments at the SSS corner, the VDD can be about 0.765 V and the reference voltage $V_{ref}$ can be about 0.7 V. The second voltage can be about 1.465/2K. The factor K can be any number that can provide the second voltage (VDD+$V_{ref}$)/2K falling within the margin that can keep the transistors 211, 213, 215, 217, and 219 operate under the saturation modes. In embodiments, the margin can be between about 0.1 V and about 0.265 V. The factor K can be any number that 0.1≦1.465/2K≦0.265. In other embodiments, the means of the margin, e.g., 0.183 is selected and equal to 1.465/2K, wherein the factor K is about 4. Since the first voltage VPP/2K and the second voltage (VDD+$V_{ref}$)/2K can keep all of the transistors 211, 213, 215, 217, and 219 at that saturation modes at the SSS corner, they can also maintain all of the transistors 211, 213, 215, 217, and 219 at that saturation modes during normal operations.

It is noted that the above description regarding operating the transistors 211, 213, 215, 217, and 219 under the saturation modes is merely exemplary. In other embodiments, the factor K can be selected such that at least one of the transistors 211, 213, 215, 217, and 219 operate under a non-saturation mode, e.g., triode mode, as long as the comparator 210 can distinguish the first voltage VPP/2K from the second voltage (VDD+$V_{ref}$)/2K for enabling or disabling the charge pump 130. In still other embodiments, the factor K is capable of maintaining at least one of the transistors 211, 213, 215, 217, and 219 operating under the saturation mode. It is also noted that the margin for keeping the transistors 211, 213, 215, 217, and 219 operating under the saturation modes can be changed depending on the type, number, and/or configurations of the transistors 211, 213, 215, 217, and 219 of the comparator 210. One of skill in the art is able to select the factor K and the margin to provide a desired operation of the comparator 210.

In some embodiments, the internal voltage VDD and the reference voltage $V_{ref}$ may be fixed after circuit and/or device testing. As noted, if the memory circuit operates at the SSS corner, the headroom of the comparator 210 may be reduced. The small headroom may affect the margin during which the transistors 211, 213, 215, 217, and 219 operate under the saturation modes. It is found that the second voltage (VDD+$V_{ref}$)/2K can be predetermined to fall within the margin, e.g., between about 0.1 V and about 0.265 V. For example, the second voltage (VDD+$V_{ref}$)/2K can be predetermined around 0.183 V. The predetermined second voltage (VDD+$V_{ref}$)/2K can be usable as a reference voltage to be compared with the first voltage VPP/2K, while keeping the operations of the transistors 211, 213, 215, 217, and 219 under saturation modes. The small headroom issue can thus be desirably eliminated or reduced.

Referring again to FIG. 2, the regulator 140 can include a means 230 for providing the second voltage (VDD+$V_{ref}$)/2K to the second input end 210b of the comparator 210. In some embodiments, the means 230 is free from using an amplifier and/or a negative feedback loop, desirably providing the second voltage (VDD+$V_{ref}$)/2K to the second input end 210b of the comparator 210. The amplifier-free means 230 can desirably reduce delays for enabling or disabling the charge pump 130 after overshoots or undershoots of the pump voltage VPP are detected.

In some embodiments, the means 230 for providing the second voltage (VDD+$V_{ref}$)/2K can include a second voltage divider, e.g., voltage divider 240 and a third voltage divider, e.g., voltage divider 250. The voltage divider 240 can have an output end 240a coupled with a resistor having a third resistance $R_3$. The voltage divider 240 can be coupled between the internal power voltage VDD and a low voltage, e.g., VSS or ground. The voltage divider 250 can have an output end 250a coupled with a resistor having a fourth resistance $R_4$. The voltage divider 250 can be coupled between the reference voltage $V_{ref}$ and a low voltage, e.g., VSS or ground.

In some embodiments, the voltage divider 240 can include resistors, diodes, other suitable devices, and/or combinations thereof. For example, the voltage divider 240 can include resistors having a fifth resistance $R_5$ and a sixth resistance $R_6$. The output end 240a of the voltage divider 240 is between the resistors having resistances $R_5$ and $R_6$ and coupled with the resistor having the resistance $R_3$. In embodiments, the output end 240a of the voltage divider 240 is capable of providing a voltage VDD/K, wherein K is equal to $R_6/(R_5+R_6)$. To substantially couple the voltage VDD/K to an output end 230a of the means 230, the resistance $R_3$ can be substantially larger than the resistances $R_5$ and/or $R_6$. For example, the resistance $R_3$ can be about ten times or more of the resistance $R_5$ or $R_6$. In some embodiments, the resistance $R_3$ can be about 100 KΩ or more and the resistance $R_5$ or $R_6$ can be about 10 KΩ.

In some embodiments, the voltage divider 250 can include resistors, diodes, other suitable devices, and/or combinations thereof. For example, the voltage divider 250 can include resistors having a seventh resistance $R_7$ and an eighth resistance $R_8$. The output end 250a of the voltage divider 250 is between the resistors having resistances $R_7$ and $R_8$ and coupled with the resistor having the resistance $R_4$. In embodiments, the output end 250a of the voltage divider 250 is capable of providing a voltage $V_{ref}/K$, wherein K is equal to $R_8/(R_7+R_8)$. To substantially couple the voltage $V_{ref}/K$ to an output end 230a of the means 230, the resistance $R_4$ can be substantially larger than the resistances $R_7$ and/or $R_8$. For example, the resistance $R_4$ can be about ten times or more of the resistance $R_7$ or $R_8$. The resistance $R_4$ can be about 100 KΩ or more and the resistance $R_7$ or $R_8$ can be about 10 KΩ. In some embodiments, the resistances $R_3$ and $R_4$ can have the same resistance, the resistances $R_5$ and $R_7$ can have the same resistance, and the resistances $R_6$ and $R_8$ can have the same resistance. It is noted that the resistances, number of the resistors, and the configuration of the voltage dividers described above are mere examples. The scope of the disclosure is not limited thereto.

Referring again to FIG. 2, the resistors having the resistances $R_3$ and $R_4$ can be parallel. Since the voltage VDD/K and voltage $V_{ref}/K$ can be substantially coupled to the output end 230a of the means 230, the output end 230a of the means 230 is capable of providing the second voltage (VDD+$V_{ref}$)/2K to the input end 210b of the comparator 210. As noted, the first voltage VPP/2K is applied to the first end 210a of the comparator 210 and the second voltage (VDD+$V_{ref}$)/2K is applied to the second end 210b of the comparator 210. Since the voltages are provided to the comparator 210 by the amplifier-free means, e.g., voltage dividers, signals representing the pump voltage VPP output from the charge pump 130 and signals representing the internal voltage VDD and the reference voltage $V_{ref}$ can be swiftly applied to the comparator 210. Unlike the conventional voltage regulator having at least two stage amplifiers, the regulator 140 can substantially reduce the delays for enabling or disabling the charge pump 130.

In some embodiments, the output end (not labeled) of the comparator 210 can be coupled with at least one inverter, e.g., inverters 260 and 270, to rectify signals from the comparator 210. For example, the output signal from the comparator 210 is output to enable the charge pump 130 (shown in FIG. 1). The inverter 260 inverts the enable output signal to a disable signal. The inverter 270 then inverts the disable signal to a rectified enable signal. It is noted that the number and type of the inverters 260 and 270 may vary depending on the type of the output signals from the comparator 210 for enabling or disabling the charge pump 130. The scope of the disclosure is not limited thereto.

Figure 4:
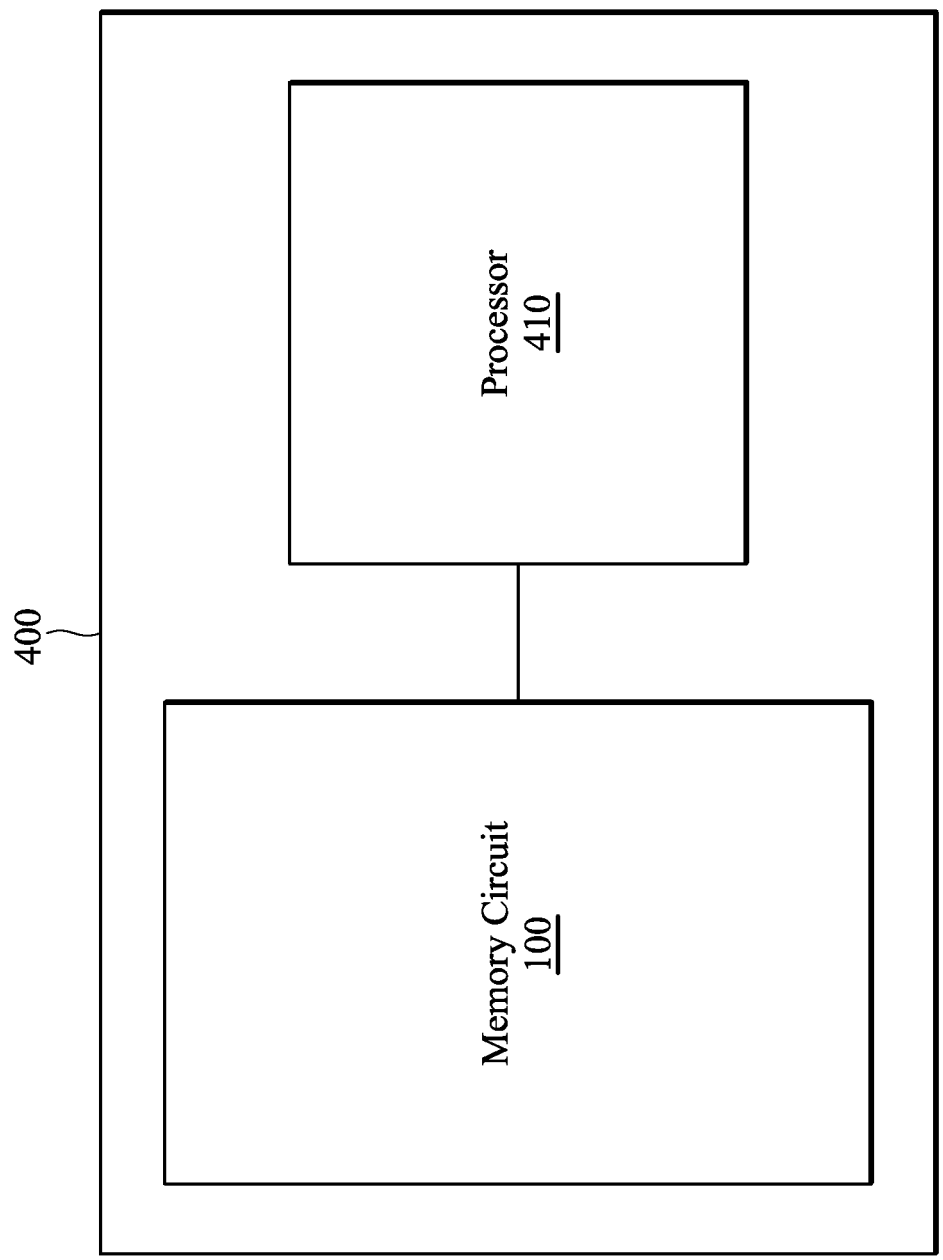
FIG. 4 is a schematic drawing illustrating a system comprising an exemplary memory circuit.

FIG. 4 is a schematic drawing showing a system including an exemplary memory circuit. In FIG. 4, a system 400 can include a processor 410 coupled with the memory circuit 100. The processor 410 is capable of accessing the datum stored in the memory cell 101a (shown in FIG. 1) of the memory circuit 100. In some embodiments, the processor 410 can be a processing unit, central processing unit, digital signal processor, or other processor that is suitable for accessing data of memory circuit.

In some embodiments, the processor 410 and the memory circuit 100 can be formed within a system that can be physically and electrically coupled with a printed wiring board or printed circuit board (PCB) to form an electronic assembly. The electronic assembly can be part of an electronic system such as computers, wireless communication devices, computer-related peripherals, entertainment devices, or the like.

In embodiments, the system 400 including the memory circuit 100 can provides an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of adjusting an output voltage generated by a charge pump, comprising:
   generating, using a first circuit, a first voltage by dividing the output voltage based on a predetermined ratio;
   generating, using a second circuit, a second voltage by dividing a power supply voltage and a reference voltage based on the predetermined ratio; and
   enabling or disabling the charge pump in response to a comparison result of comparing the first voltage with the second voltage.

2. The method of claim 1, wherein the first circuit comprises a first resistor and a second resistor, the first resistor and the second resistor connected in series, and the generation of the first voltage comprises:
   feeding the output voltage to a first end of the first resistor; and;
   outputting the first voltage at a second end of the first resistor, the second end of the first resistor connected to the second resistor.

3. The method of claim 1, wherein the second circuit comprises a third resistor, a fourth resistor, a first voltage divider, and a second voltage divider, the third resistor and the fourth resistor connected in series between the first voltage divider and the second voltage divider, and the generation of the second voltage comprises:

dividing the power supply voltage using the first voltage divider;

dividing the reference voltage using the second voltage divider; and generating, at a common node of the third resistor and the fourth resistor, the second voltage.

4. The method of claim 1, wherein
the predetermined ratio is 2K, K being a positive number,
the output voltage has a voltage level VPP, the power supply voltage has a voltage level VDD, the reference voltage has a voltage level $V_{ref}$,
the first voltage level being VPP/2K, and
the second voltage level being (VDD+$V_{ref}$)/2K.

5. The method of claim 1, wherein the comparing the first voltage with the second voltage comprises:
generating a control signal indicative of enabling the charge pump within a first predetermined time period after a determination of the first voltage being less than the second voltage.

6. The method of claim 5, wherein the first predetermined time period ranges from 1 ns to 5 ns.

7. The method of claim 1, wherein the comparing the first voltage with the second voltage comprises:
generating a control signal indicative of disabling the charge pump within a second predetermined time period after a determination of the first voltage being greater than the second voltage.

8. The method of claim 7, wherein the second predetermined time period ranges from 1 ns to 5 ns.

9. A method of controlling a charge pump, the method comprising:
generating a first voltage having a voltage level of VPP/2K, VPP being a voltage level of an output voltage of the charge pump, and K being a positive number;
generating a second voltage having a voltage level of (VDD+$V_{ref}$)/2K, VDD being a voltage level of a power supply voltage, and $V_{ref}$ being a voltage level of a reference voltage;
enabling the charge pump after a determination of the first voltage being less than the second voltage; and
disabling the charge pump after a determination of the first voltage being greater than the second voltage.

10. The method of claim 9, wherein the generation of the second voltage comprises:
generating a third voltage having a voltage level of VDD/K; and
generating a fourth voltage having a voltage level of $V_{ref}$/K.

11. The method of claim 10, wherein the generation of the second voltage further comprises:
generating the second voltage by averaging the third voltage with the fourth voltage.

12. The method of claim 9, wherein the enabling the charge pump is performed within a first predetermined time period after the determination of the first voltage being less than the second voltage.

13. The method of claim 12, wherein the first predetermined time period ranges from 1 ns to 5 ns.

14. The method of claim 9, wherein the disabling the charge pump is performed within a second predetermined time period after the determination of the first voltage being greater than the second voltage.

15. The method of claim 14, wherein the second predetermined time period ranges from 1 ns to 5 ns.

16. A circuit comprising:
a charge pump configured to generate an output voltage; and
a comparator comprising:
an output coupled to the charge pump for enabling or disabling the charge pump;
a first input configured to receive a first voltage, the first voltage being a function of a voltage level (VPP) of the output voltage; and
a second input configured to receive a second voltage, the second voltage being a function of a voltage level (VDD) of a power supply voltage and a voltage level ($V_{ref}$) of a reference voltage.

17. The circuit of claim 16, wherein the first voltage has a voltage level of VPP/2K, K being a positive number.

18. The circuit of claim 17, further comprising:
a first resistor having a first resistance (R1), the first resistor comprising a first end coupled to the charge pump and a second end; and
a second resistor having a second resistance (R2), a first end of the second resistor coupled to the second end of the first resistor,
wherein K equals (R1+R2)/2R2.

19. The circuit of claim 16, wherein the second voltage has a voltage level of (VDD+$V_{ref}$)/2K, K being a positive number.

20. The circuit of claim 19, further comprising:
a first voltage divider configured to output a third voltage having a voltage level of VDD/K;
a second voltage divider configured to output a fourth voltage having a voltage level of $V_{ref}$/K; and
a resistor ladder coupled between the first voltage divider and the second voltage divider and configured to output the second voltage in response to the third voltage and the fourth voltage.

* * * * *